United States Patent
Daniels et al.

(10) Patent No.: US 9,070,669 B2
(45) Date of Patent: Jun. 30, 2015

(54) WETTABLE LEAD ENDS ON A FLAT-PACK NO-LEAD MICROELECTRONIC PACKAGE

(71) Applicant: Freescale Semiconductor, Inc., Austin, TX (US)

(72) Inventors: Dwight L. Daniels, Phoenix, AZ (US); Alan J. Magnus, Gilbert, AZ (US); Pamela A. O'Brien, Chandler, AZ (US)

(73) Assignee: Freescale Semiconductor, Inc., Austin, TX (US)

(*) Notice: Subject to any disclaimer, the term of this patent is extended or adjusted under 35 U.S.C. 154(b) by 242 days.

(21) Appl. No.: 13/673,212

(22) Filed: Nov. 9, 2012

(65) Prior Publication Data

US 2014/0134799 A1  May 15, 2014

(51) Int. Cl.
*H01L 21/48* (2006.01)
*H01L 23/495* (2006.01)
*H01L 23/00* (2006.01)

(52) U.S. Cl.
CPC ...... *H01L 21/4821* (2013.01); *H01L 23/49582* (2013.01); *H01L 24/97* (2013.01)

(58) Field of Classification Search
None
See application file for complete search history.

(56) References Cited

U.S. PATENT DOCUMENTS

| | | | |
|---|---|---|---|
| 4,776,508 A | 10/1988 | Tanny | |
| 6,608,366 B1 | 8/2003 | Fogelson et al. | |
| 6,709,892 B2 | 3/2004 | Kobayakawa et al. | |
| 7,023,074 B2 | 4/2006 | Li et al. | |
| 7,105,383 B2 | 9/2006 | Vo et al. | |
| 7,183,630 B1 | 2/2007 | Fogelson et al. | |
| 7,397,112 B2 | 7/2008 | Sato et al. | |
| 7,410,834 B2 | 8/2008 | Fukaya et al. | |
| 7,443,043 B2 | 10/2008 | Sakamoto | |
| 7,932,587 B2 | 4/2011 | Lehmann | |
| 8,017,447 B1 | 9/2011 | Olsen | |
| 2010/0052192 A1* | 3/2010 | Hasegawa et al. | 257/797 |
| 2011/0033977 A1 | 2/2011 | Huening | |
| 2011/0108965 A1 | 5/2011 | Hess et al. | |
| 2011/0263077 A1 | 10/2011 | Bai et al. | |

OTHER PUBLICATIONS

Koschmieder et al., "Soldering the QFN Stacked Die Sensors to a PC Board", Application Note AN1902 Rev 5, Apr. 2010, 9 pages, Freescale Semiconductor, Inc., US.
Xia et al., "QFN (Quad Flat Pack No-Lead)", Application Note AN4530 Rev 0, May 2012, 37 pages, Freescale Semiconductor, Inc., US.

* cited by examiner

*Primary Examiner* — Charles Garber
*Assistant Examiner* — Stanetta Isaac (57) ABSTRACT

Methods of manufacturing a flat-pack no-lead microelectronic package (2100) coat exposed base metal at a cut end of a lead frame of the package with solder (1001). One method coats the exposed base metal with solder when the package is in a strip (200, 300). Another method coats the exposed base metal with solder after the package is singulated. As a result, all portions of leads of the package that may receive solder during mounting of the package to a printed circuit board are solder wettable. A solder wettable lead end (504) on the package facilitates formation of a solder fillet during mounting of the package.

20 Claims, 10 Drawing Sheets

WETTABLE LEAD ENDS ON A FLAT-PACK NO-LEAD MICROELECTRONIC PACKAGE

BACKGROUND

1. Field

This invention relates generally to semiconductor device manufacturing, and more specifically to treatment of lead ends of flat-pack no-lead semiconductor device packages.

2. Related Art

A lead frame strip (hereinafter "strip") is populated with a plurality of lead frames. A semiconductor or microelectronic device is mounted on each lead frame and encapsulated with a mold compound. Lead frames are separated during singulation of the strip to create individual semiconductor or microelectronic packages (hereinafter "package(s)"). A package utilizes leads for externally providing and receiving signals and power. One type of package is a flat-pack no-lead package where each lead, or terminal, is exposed at a bottom and at a side of the package.

Most known methods of manufacturing flat-pack no-lead packages result in leads that have at least some exposed base metal on an end, or flank, of each lead. An oxide coating forms on surfaces of base metal of the lead frame that become exposed to air as result of being cut during singulation. Typically, the base metal of the lead frame of a flat-pack no-lead package is copper (Cu), and the oxide is a copper oxide, for example, $Cu_2O$, $CuO$ and $CuO_2$. Solder tends to adhere to a surface that is solder wettable; however, copper oxide is not solder wettable.

Solder paste includes solder and flux. A purpose of flux is to clean and activate a surface of a base metal. There are different activity levels, or strengths, of flux. Higher activity levels can prepare surfaces that have more oxide and/or contaminants. Flux removes any oxide that may have formed on the surface of a cut end of a lead, thereby allowing solder to more readily adhere to the cut end of the lead.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

One known method of manufacturing flat-pack no-lead packages pre-applies solder in a region of the lead end. This known method includes forming a through-hole feature, which is a hole that goes completely through a thickness of the lead frame metal, and requires solder (or another wettable material) to be applied prior to the molding process of assembly. This known method also requires that the pre-applied solder completely close off the through-hole feature. Disadvantageously, this known method results in solder on only a portion of the end of leads and not on the entire end of the leads.

Another known method of manufacturing flat-pack no-lead packages describes electroless plated lead ends, but disadvantageously requires electroless post-saw plating chemistry.

All known methods of manufacturing flat-pack no-lead packages employ a lead frame feature other than a simple, straight cut of the lead end and/or they require chemical plating as a step for making the exposed lead frame metal wettable. On the other hand, some embodiments of the invention do not require a lead frame design change and do not require any plating bath or plating chemistry maintenance.

The lead frame of most known flat-pack no-lead packages have at least one surface of exposed base metal, which occurs after, and as a result of, singulation. Such surface is in a plane approximately orthogonal to a plane of a bottom of the flat-pack no-lead package. Such exposed base metal is not considered a solder wettable (hereinafter "wettable") surface.

A solder fillet is an extension of the solder joint at a side of a flat-pack no-lead package. A presence or absence of a solder fillet can be evidence of the quality of electrical connection between a lead of a flat-pack no-lead package and a PCB. Solder is not apt to wick up a side, or flank, of a lead of most known flat-pack no-lead packages because the solder is not likely to wet to an oxide on exposed metal at a cut end of the lead. Consequently, a solder fillet may not be seen during visual inspection because it does not exist or because it is very small.

Some embodiments in accordance with the invention coat the exposed base metal at the cut end of the lead frame of a flat-pack no-lead package with solder to promote wetting during board mount. When a flat-pack no-lead package (hereinafter "package") is manufactured in accordance with embodiments of the invention, all portions of leads that are expected to receive solder during mounting to a printed circuit board ("PCB") are advantageously wettable. A wettable cut end of the leads of a package facilitates formation of a solder fillet. Because of the coating of solder on the cut end of the leads, when the package is mounted to a PCB, solder adheres to the cut end of the lead at the sides of the package just as well as solder adheres to plated surfaces at the bottom of the package. The coating of solder encourages wicking of solder up the cut end of the leads at the sides of the package so that evidence of a solder joint is readily inspectable by a person or by an automated inspection device.

The methods in accordance with the invention eliminate, or at least greatly reduce, an area of the surface of base metal of the lead frame that remains exposed (and therefore not wettable) after package singulation. The methods advantageously provide that a surface of the lead frame located in a plane approximately orthogonal to a plane of a bottom of a package is wettable.

A package has solder joints that are concealed under the package, after it is soldered, or mounted, to a PCB or another mounting surface. To properly perform visual inspection, it is desirable that at least some solder should be visible beyond a perimeter of the package after the package is mounted to a PCB. A package made in accordance with the invention promotes formation of inspectable solder joints of a package after it is mounted to a PCB. A package made in accordance with at least some embodiments of the invention produces a consistent solder joint that meets requirements of automated solder joint inspection systems. A package made in accordance with the invention is more likely to result in inspectable solder joints after it is mounted to a PCB because no portion of leads that might be expected to receive solder during mounting to a PCB is exposed base metal.

Applying solder to the base metal of the lead frame that disadvantageously becomes exposed during singulation creates a feature that promotes wetting during board mount. This is sometimes called "pre-tinning" because tin (Sn) is a major component of solder, and to distinguish such application of solder from a later application of solder at the time of mounting the package to a PCB. The methods in accordance with some embodiments of the invention pre-apply solder to up to 100% of the surface of each lead end. As a result, some embodiments provide a lead end that is wettable over a full width, i.e., cross-section, of the lead.

Figure 1:
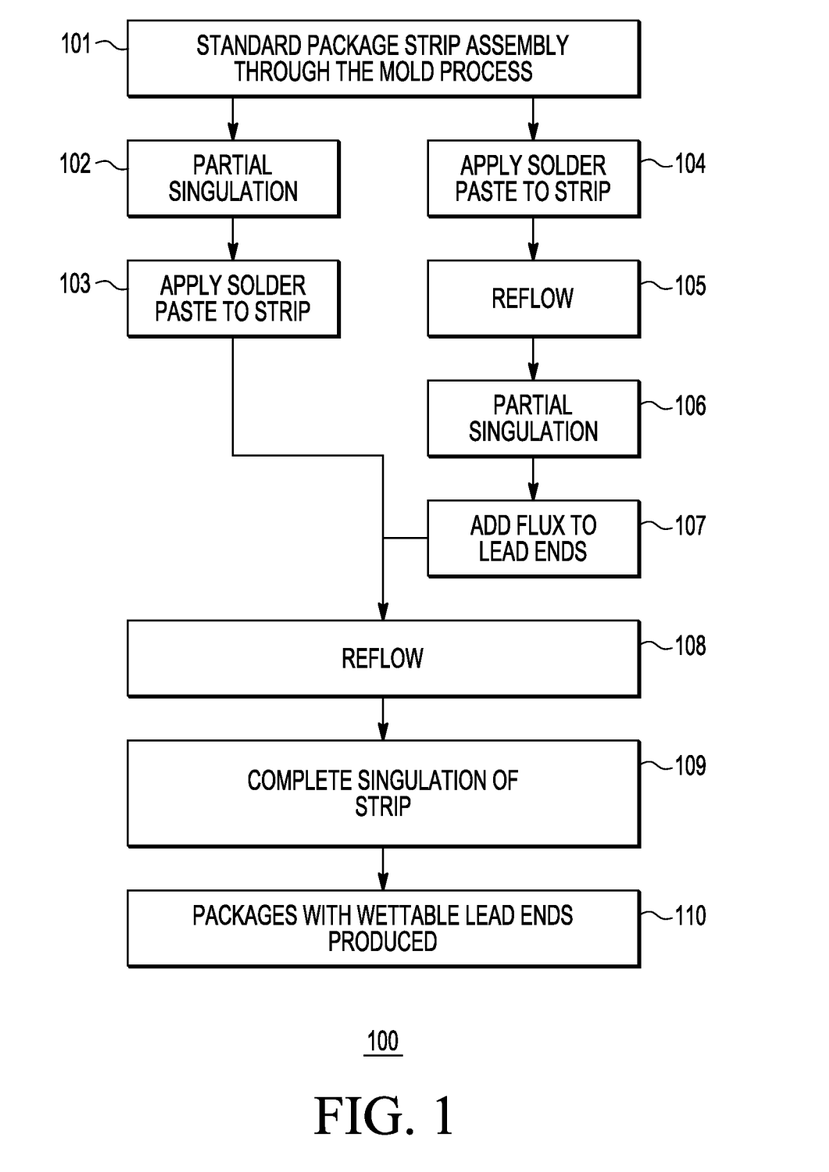
FIG. 1 is a flow diagram illustrating steps of a method of manufacturing a flat-pack no-lead package prior to singulation of a strip, in accordance with several embodiments of the invention.
Figure 2:
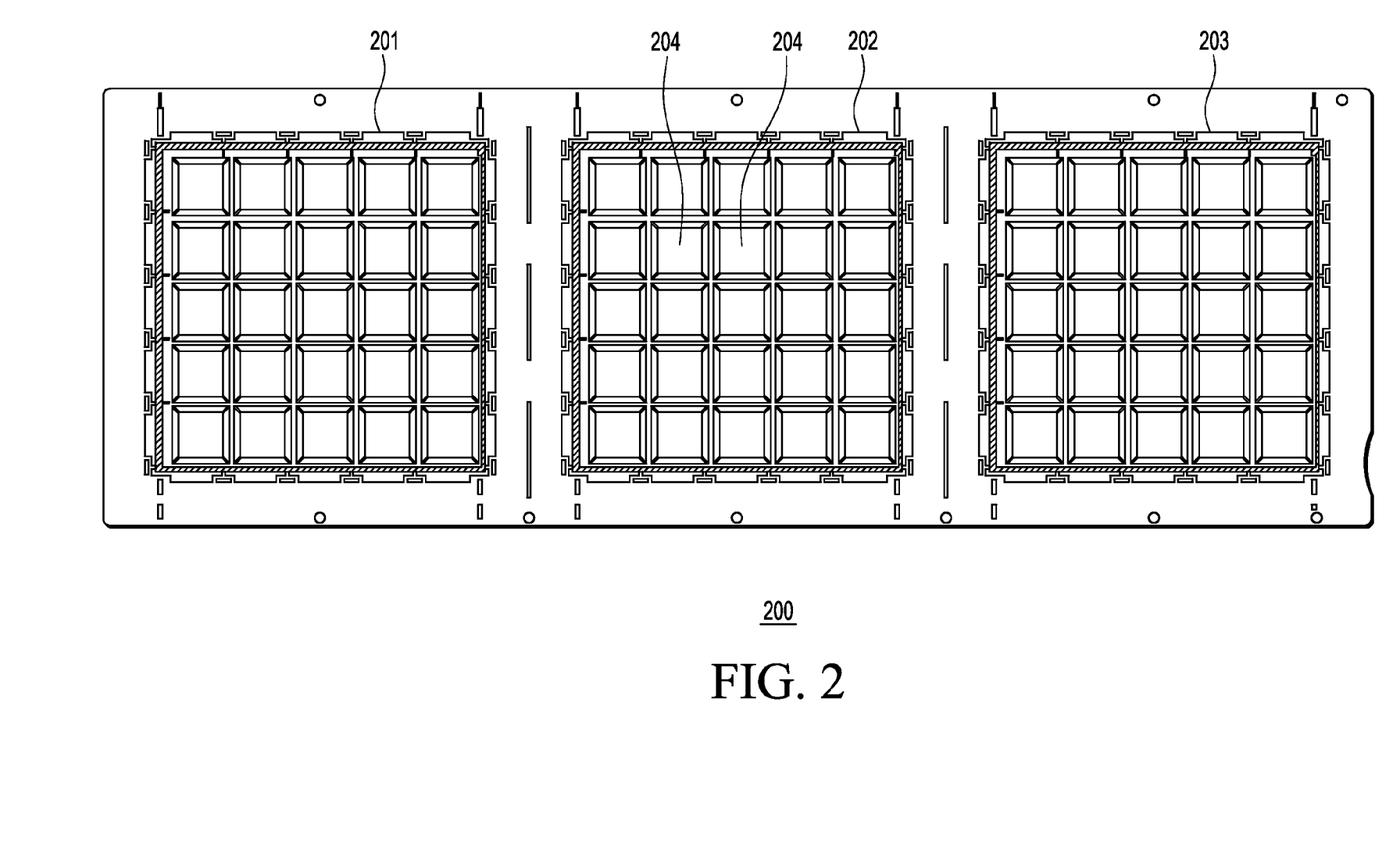
FIG. 2 is plan view of a representative strip.
Figure 3:
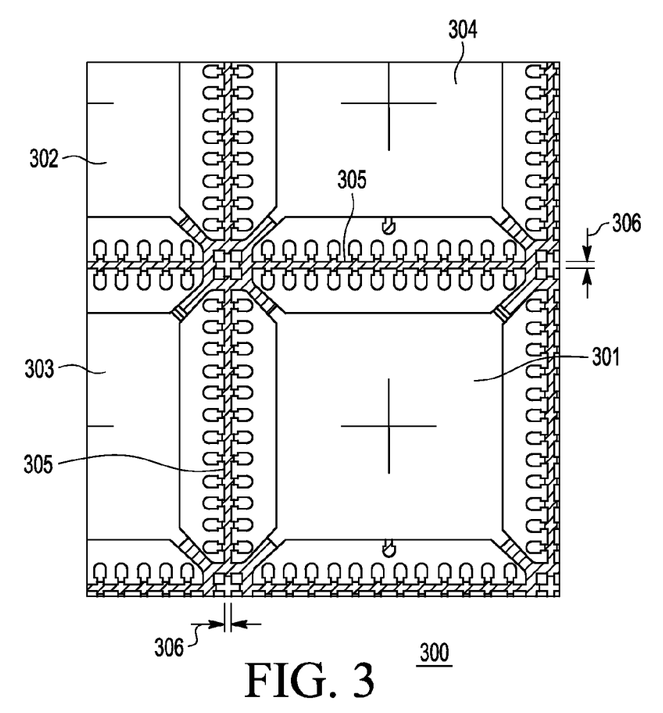
FIG. 3 is a corner of another representative strip showing one entire lead frame and portions of adjacent lead frames.
Figure 4:
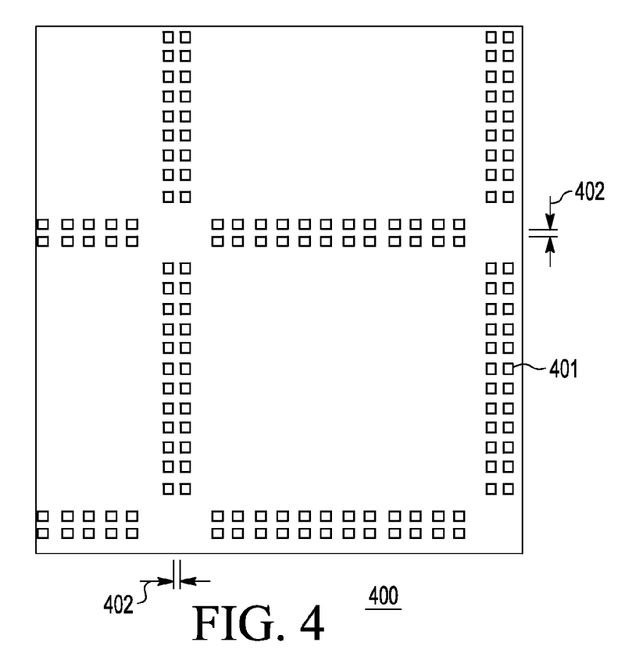
FIG. 4 is corner of a stencil that may be used with one method of manufacturing a flat-pack no-lead package in accordance with one embodiment of the invention.
Figure 5:
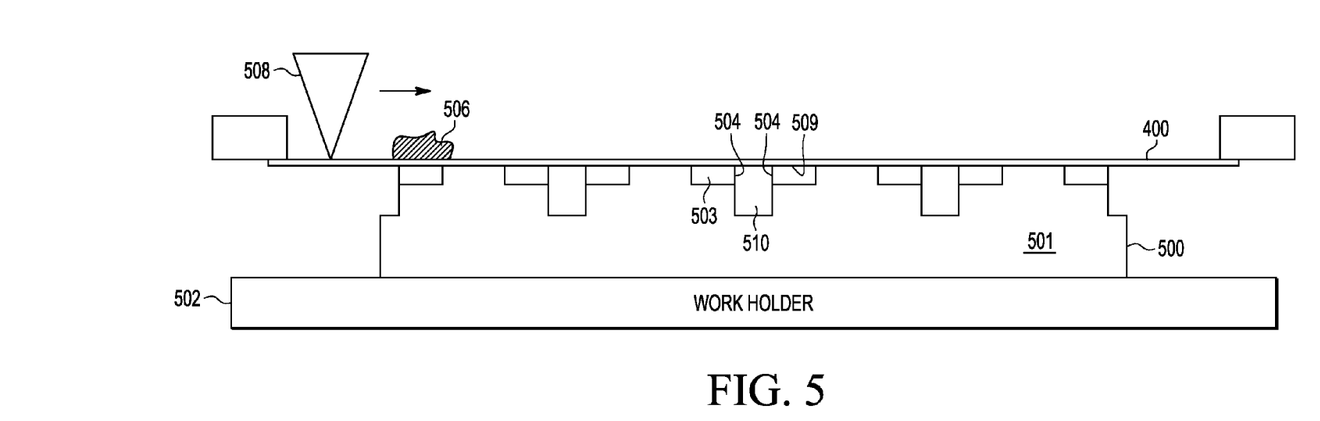
FIG. 5 is a cut view of a four lead frame portion of a partially singulated strip on a work holder, a stencil, solder paste, and a wiper blade, prior to stencil printing.

FIG. 1 is a flow diagram 100 illustrating steps of a method of manufacturing the package 2100 (see FIG. 21) in accordance with several embodiments of the invention. FIG. 2 is a plan view of a representative strip 200. In some embodiments, the representative strip 200 can have three arrays 201, 202 and 203, each array having a plurality of lead frames 204. FIG. 3 is a corner of an array of another representative strip 300 showing one entire lead frame 301 and portions of adjacent lead frames 302, 303 and 304. The strip 300 has a saw lane 305 between lead frames. FIG. 4 is corner of a stencil 400 that may be used with the strip 300 during one of the methods of manufacturing the package 2100 illustrated by the flow diagram 100. The stencil 400 has a plurality of openings 401. FIG. 5 is a cut view of a four lead frame portion 500 of a partially singulated strip, such as strip 200 or 300. The four lead frame portion 500 includes mold compound 501 and base metal 503. The exposed base metal 503 has a plating 509 on it. The term "plating" as used herein means a coating of some material, other than solder or an organic surface protectant, on a surface of a lead frame to protect the lead frame from oxidation. For most embodiments, the strip 300 is plated while still in strip form with, for example, matte tin, nickel palladium, nickel palladium gold, or another wettable composition, using wet chemistry. FIG. 5 shows the four lead frame portion 500 on a work holder 502; a stencil, such as stencil 400; solder cream or solder paste (hereinafter "paste") 506; and a squeegee, or wiper blade, 508, prior to stencil printing. Typically, a size of a work holder is much larger than a size of a strip; therefore, more than one strip can be stencil printed in a single operation.

FIG. 1 describes steps for applying solder to the cut ends 504 (see FIG. 5) of the strip 300 prior to singulation of the strip. After singulation, the cut ends of the strip 300 will become the ends of the leads of a package. Manufacturing, or assembly, of the package 2100 begins after step 101 which is standard assembly up to and including mold process. Typically, during standard assembly, step 101, the exposed portion of the strip 300 was plated, and is therefore wettable. There is a left branch and a right branch in the flow diagram 100. Each branch of the flow diagram 100 represents different embodiments.

In the left branch of the flow diagram 100, a first step 102 comprises performing partial singulation of the strip 300 along the saw lanes 305 by sawing or by etching. At this step, all the base metal 503 of the lead frame is removed along each saw lane 305 of the strip 300, thereby forming a trench, or channel, 510, but the mold compound 501 along the saw lanes 305 is not completely removed. The phrase "partial singulation" means removing the entire cross-section of each lead along the saw lanes 305, but not removing most, if any at all, of the mold compound 501 along the saw lanes. In one embodiment, a width 306 of each saw lane 305 of strip 300 is approximately 300 microns wide. For such 300 micron wide saw lane 305, a blade used for performing the partial singulation of step 102 is at least 350 microns wide, in one embodiment. As a direct result of the removal of some of the metal of the lead frame in step 102, base metal 503 of the lead frame at the cut ends 504 of the lead frame becomes exposed along the saw lanes 305 of the strip 300. In step 103, paste 506 is applied to the lead frame and to an area slightly beyond the cut end of the lead frame, i.e., slightly over the edges of the channels 510 produced in step 102, but the paste is not applied over an entire width of the channel 510. To accomplish applying paste 506 to the area slightly beyond the cut end of the lead frame, a stencil 400 is used for applying paste 506 to the strip 300. A distance 402 between some of the openings 401 in the stencil 400 is about 100 microns in one embodiment, when the stencil is used with the strip 300.

Figure 6:
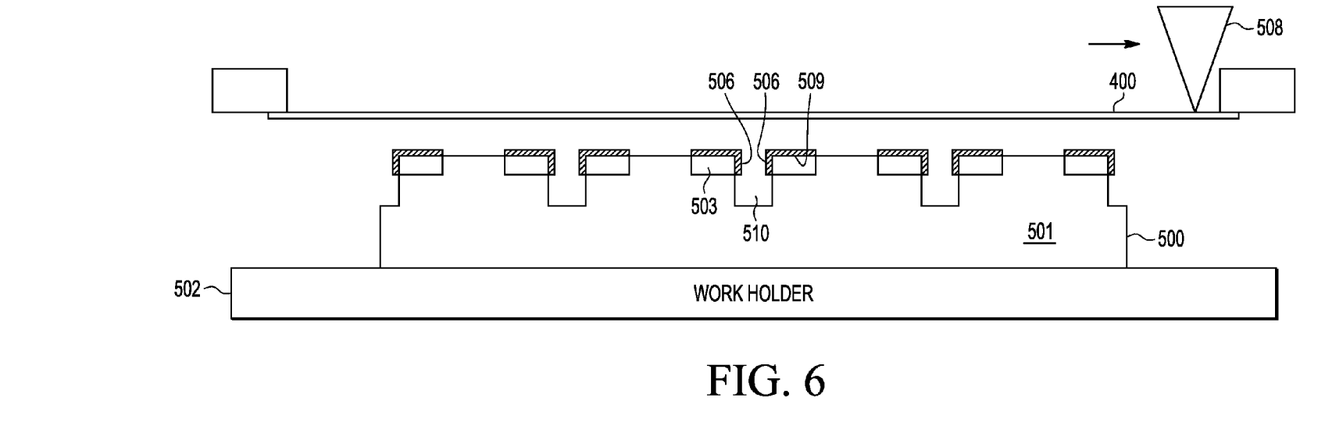
FIG. 6 is a cut view of the four lead frame portion of the partially singulated strip on the work holder and the stencil of FIG. 5, subsequent to stencil printing the solder paste on the lead frames of the strip.

FIG. 6 is a cut view of the four lead frame portion 500 of the partially singulated strip 300 subsequent to step 103. A reason for applying paste 506 to the entire lead frame of the strip 300 (as opposed to applying paste to only where solder 1001 is intended) is that the plated surface of the lead frame wets much more easily than does bare base metal 503 at the cut ends 504 of the lead frame. Therefore, if a small volume of paste 506 were applied only near, or at, the bare metal at the cut end of the lead frame, the paste may preferentially wet to the plated area and may "rob" solder from areas of bare base metal 503, possibly leaving portion(s) of the cut end 504 of the lead frame without a coating of solder 1001 (see FIG. 10). By applying paste 506 to the whole lead frame and beyond, there is ample paste to ensure that the cut ends 504 of the lead frame are coated with solder 1001 after reflow. In another embodiment, applying paste 506 only near the cut end of the lead frame of the strip 300 may be sufficient. In one embodiment, the paste 506 is Indalloy® with NC-SMQ90 flux vehicle, manufactured by The Indium Corporation of America, of Utica, N.Y. However, any alloy that is considered "solder" can be used. FIG. 6 shows that paste 506 advantageously covers the formerly bare base metal 503 at the cut ends 504 of the lead frame.

Figure 7:
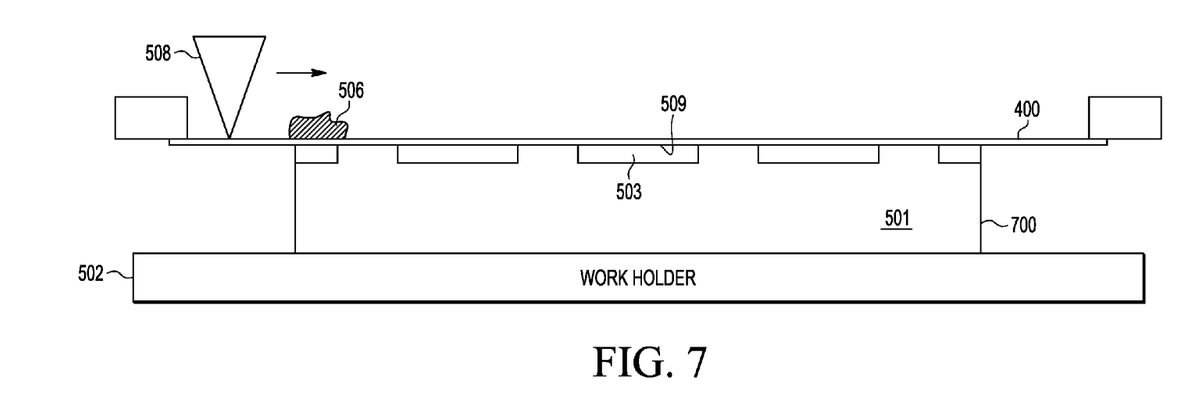
FIG. 7 is a cut view of a four lead frame portion of a strip, a work holder, a stencil, and solder paste, prior to stencil printing.
Figure 8:
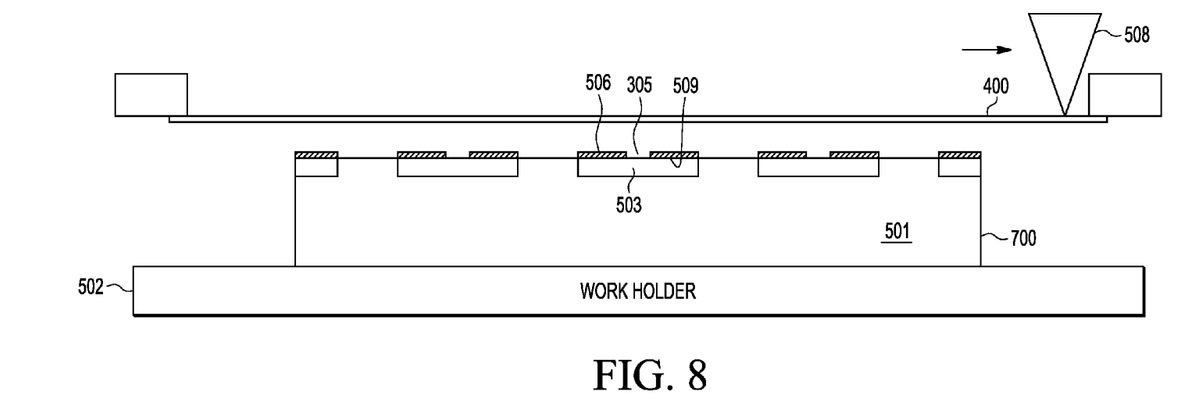
FIG. 8 is a cut view of the four lead frame portion of the strip, the work holder and the stencil of FIG. 7, subsequent to stencil printing the solder paste on the lead frames of the strip, wherein the solder paste is not printed on cut lanes.
Figure 9:
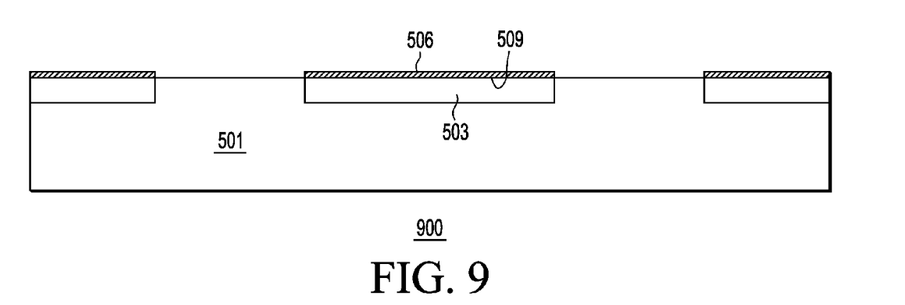
FIG. 9 is a cut view of a two lead frame portion of a strip and showing solder paste on the two lead frame portion of the strip.

In the right branch of the flow of the flow diagram 100, a first step 104 comprises applying paste 506 to the lead frame of the strip 300, prior to partial singulation. The step of applying paste 506 in some embodiments includes a step of applying solder 1001 by one of: screen printing, solder performs, solder balls, using solder jetting, and using nanoparticle printing/spraying. FIG. 7 is a cut view of a four lead frame portion 700 of a strip, such as strip 200 or 300; the work holder 502; a stencil, such as stencil 300 or 400; and paste 506, prior to stencil printing. There are two choices in applying the paste 506 prior to singulation. Each of these two choices uses a different stencil 400 of its own design. In a first choice, the paste 506 is applied over the entire portion of the lead frame that is not covered with mold compound 501, except over the saw lanes 305. An advantage of not applying paste 506 over the saw lanes 305 is a reduction in a possibility that solder 1001 (see FIG. 10) will load the blade that will be used in step 106 for performing the partial singulation. FIG. 8 is a cut view of the four lead frame portion 700 of the strip shown in FIG. 7, subsequent to step 104. FIG. 8 shows that the paste 506 is not printed over the saw lanes 305 pursuant to the first choice. In a second choice, the paste 506 is applied, instead, over the entire portion of the lead frame that is not covered with mold compound 501, including over the saw lanes 305. FIG. 9 is a cut view of a two lead frame portion 900 of a strip, such as strip 200 or 300, showing paste 506 on the two lead frame portion of the strip pursuant to the second choice. Regardless of selecting the first choice or the second choice in applying the solder paste 506, step 105 is performed next. In step 105, the paste 506 is reflowed. In step 105, the paste 506 is reflowed at a temperature above the melting point of solder for approximately 45-90 seconds, but a time and a peak temperature depends on the type of paste. In one embodiment of step 105, the paste 506 is reflowed at a temperature of approximately 215° C. for 50-70 seconds for NC-SMC90 paste.

Figure 10:
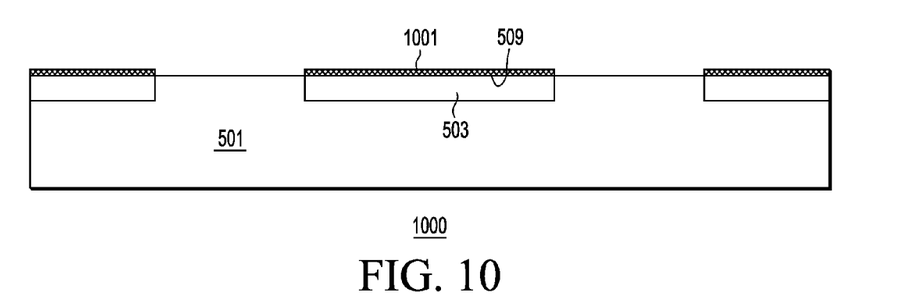
FIG. 10 is a cut view of the two lead frame portion of a strip of FIG. 9, after reflow.

FIG. 10 is a cut view of a two lead frame portion 1000 after reflow of the strip shown in FIG. 9. FIG. 10 shows that there is now a layer, or coating, of solder 1001 on the base metal 503 of the lead frame. Regarding the thickness of the coating of solder: thinner is better. Excessive solder 1001 may result in a co-planarity issue. If there are two leads with excessive solder that are located on either side of a lead with little solder, the middle lead may not properly contact the PCB at final assembly.

Figure 11:
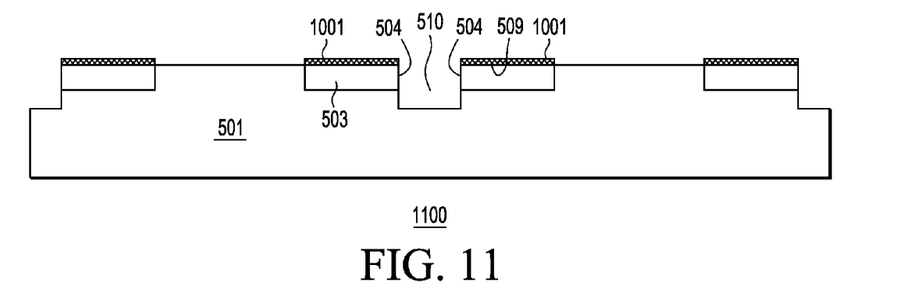
FIG. 11 is a cut view of the two lead frame portion of the strip of FIG. 10 after partial singulation.

In step 106, the metal of the lead frame is removed along saw lanes 305 by sawing or by etching, similar to step 102. FIG. 11 is a cut view of a two lead frame portion 1100 showing solder 1001 on the lead frame, after partial singulation of the strip shown in FIG. 10. In step 107, flux (not shown) is added to the exposed base metal 503 at the cut ends 504 of the lead frame. The addition of flux at this juncture will improve flow of the solder 1001 during step 108. The flux helps ensure that the solder 1001 will cover the exposed base metal 503 at the cut ends 504 during step 108.

Figure 12:
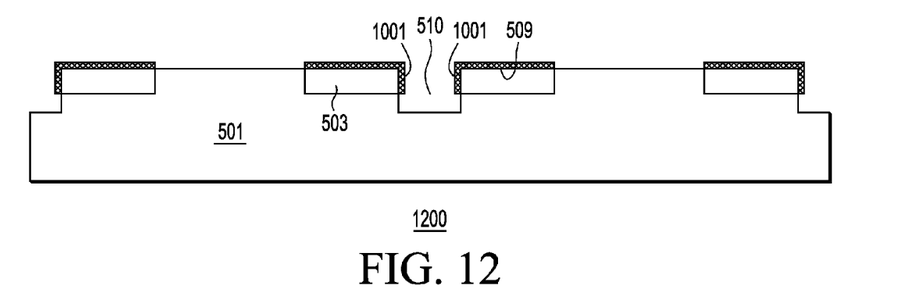
FIG. 12 is a cut view of the two lead frame portion of the strip of FIG. 11, after reflow.

Step 108 is the next step for both the left and right branches of the flow diagram 100. In step 108, the strip 300 is reflowed, and solder 1001 goes in the channel 510 and on the cut ends 504 of the lead frame. FIG. 12 is a cut view of a two lead frame portion 1200 after reflow of the strip shown in FIG. 11. In one embodiment of step 108, the paste 506 is reflowed at a temperature above the melting point of solder for approximately 45-90 seconds, but a time and a peak temperature depends on the type of paste. As a result, the base metal 503 at the cut ends 504 of the lead frame is no longer exposed to air. Consequently, the cut ends of the lead frame are now wettable. In step 109, the strip 300 is completely singulated using a blade narrower than the blade used in the steps of partial singulation, steps 102 and 106, so as to avoid removing any of the solder 1001 that was just applied to the cut ends 504 of the lead frame. For a strip, such as strip 300 that has 300 micron wide saw lane 305, the narrower blade used to perform the complete singulation of step 109 is approximately 300 microns wide, in one embodiment. At step 110, packages 2100 that have wettable lead ends have been produced.

An advantage of the method set forth in the left branch of the flow diagram 100 is that only one reflow step (step 108) is performed. An advantage of the method set forth in the right branch of the flow diagram 100 is better control of solder application.

Regarding the method shown in FIG. 1, solder 1001 can be applied to a strip, such as strip 200 or 300, using any method that meets the desired conditions below. For example, one method would be to apply paste 506 using a stencil, such as stencil 400, as shown in FIGS. 5, 6, 7 and 8. The amount of paste 506 applied is controlled by a size of openings 401 in the stencil 400 and by a thickness of the stencil. In one embodiment, the stencil 400 has a thickness of 4 mil. Various embodiments of the stencil 400 are described as follows.

In one embodiment, the stencil 400 is designed with openings 401 sized and aligned such that paste 506 is applied to all of the lead areas and such that solder 1001 is prevented from contacting exposed ground plane that does not have exposed base metal.

In another embodiment, the stencil 400 is designed with openings 401 sized and aligned such that paste 506 is applied to all of the lead areas except over the saw lanes 305, and such that solder 1001 is prevented from contacting exposed ground plane that does not have exposed base metal.

In still another embodiment, the stencil 400 is designed with openings 401 sized and aligned such that paste 506 is applied to all of the lead areas and to some of the area over the channels 510. By using a stencil 400 in which some of the openings 401 are elongated in a direction beyond the cut end 504 of each lead, the method prints a pattern of paste 506 on a solder paste carrier 1401 (see FIGS. 14-18), wherein the paste extends beyond where the location of the cut end of each lead. This added volume of paste 506 enables wetting of the exposed base metal at the reflow step. The stencil 400 is also designed with openings 401 sized and aligned such that solder 1001 is prevented from contacting exposed ground plane that does not have exposed base metal 503.

Figure 13:
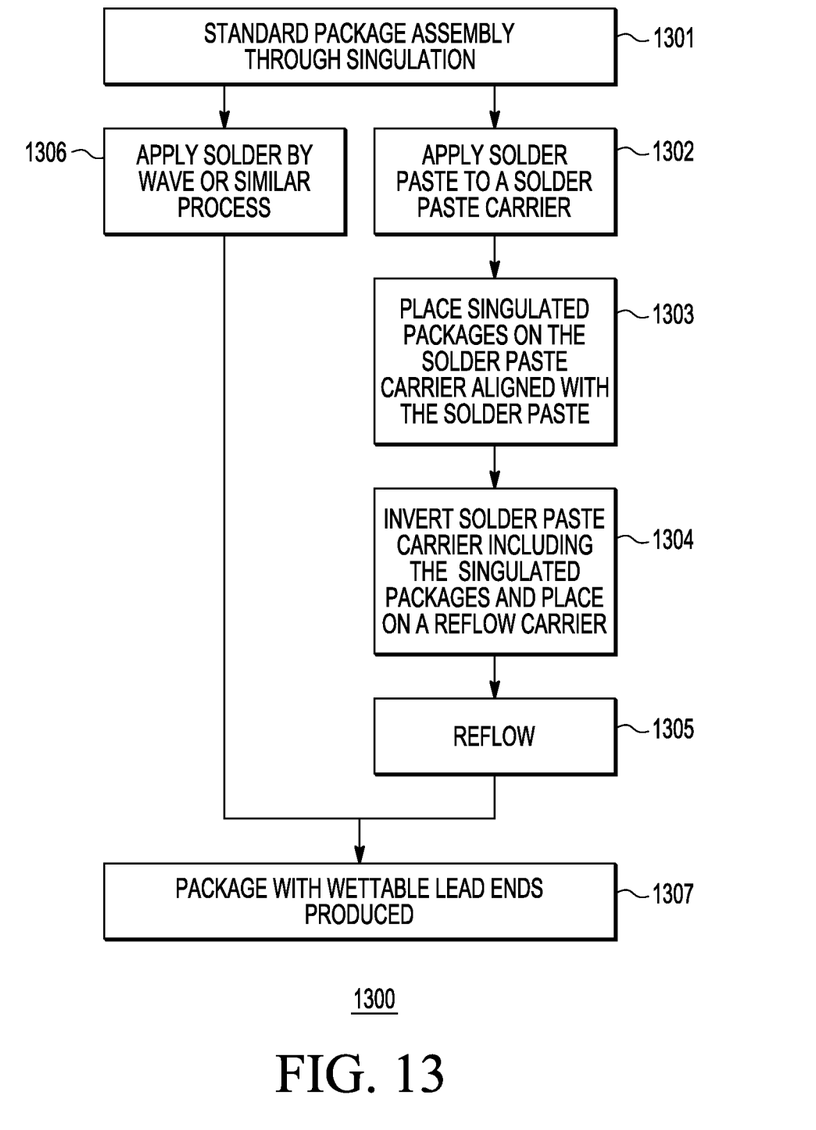
FIG. 13 is a flow diagram illustrating steps of a method of manufacturing a flat-pack no-lead package subsequent to singulation of a strip, in accordance with several other embodiments of the invention.

FIG. 13 is a flow diagram 1300 illustrating steps of a method of manufacturing the package 2100 in accordance with several other embodiments of the invention. FIG. 13 describes steps for applying solder 1001 to the exposed base metal of the cut ends 504 of the lead frame of a package 1601 (see FIG. 16). Manufacturing, or assembly, of the package 2100 in accordance with the invention begins at step 1301 with standard assembly up to and including singulation. Standard assembly has produced a package 1601 that disadvantageously has a non-wettable surface on the lead ends. There are two alternate variations in the flow of the flow diagram 1300.

Figure 14:
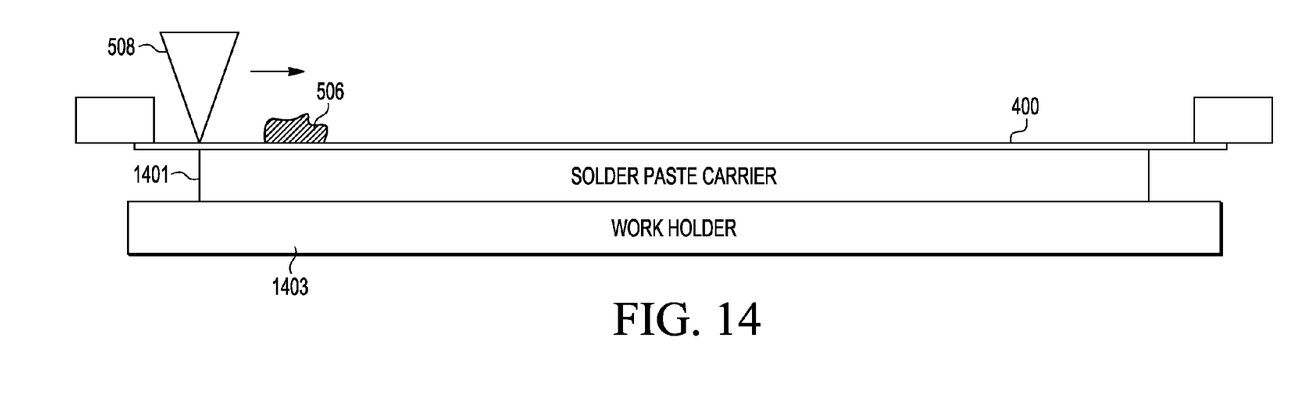
FIG. 14 is a cut view of solder paste, a stencil, and a solder paste carrier on a work holder, prior to stencil printing.

FIG. 14 is a cut view of paste 506, a stencil such as stencil 400, and the solder paste carrier 1401 on a work holder 1403, prior to stencil printing paste on the carrier. The solder paste carrier 1401 is a flat piece of ceramic or another material to which solder does not adhere, i.e., a non-wettable material.

In a first alternate variation in the flow of the flow diagram 1300, a first step 1302 comprises applying paste 506 to the solder paste carrier 1401. The paste 506 is applied to areas on the solder paste carrier 1401 that correspond to the area of each lead of the package 1601 and a little beyond each lead in the direction of the cut end 504 of each lead. Typically, a size of a solder paste carrier is much larger than a size of a package; therefore, the paste 506 that is applied to the solder paste carrier 1401 at step 1302 is paste for a plurality of packages 1601.

Figure 15:
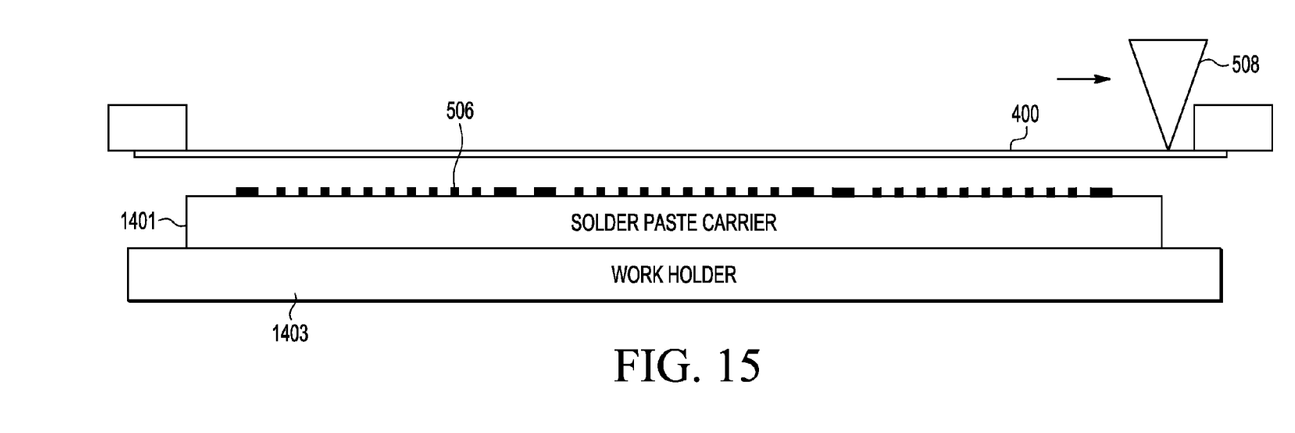
FIG. 15 is a cut view of the stencil, the solder paste carrier and the work holder of FIG. 14, subsequent to stencil printing.

FIG. 15 is a cut view of a stencil such as stencil 400, the solder paste carrier 1401 and the work holder 1403, subsequent to stencil printing the paste 506 on the solder paste carrier. At step 1303, one or more singulated, packages 1601 are placed on the paste 506 which is on the solder paste carrier 1401, such that the leads of the packages are aligned with the paste on the carrier.

Figure 16:
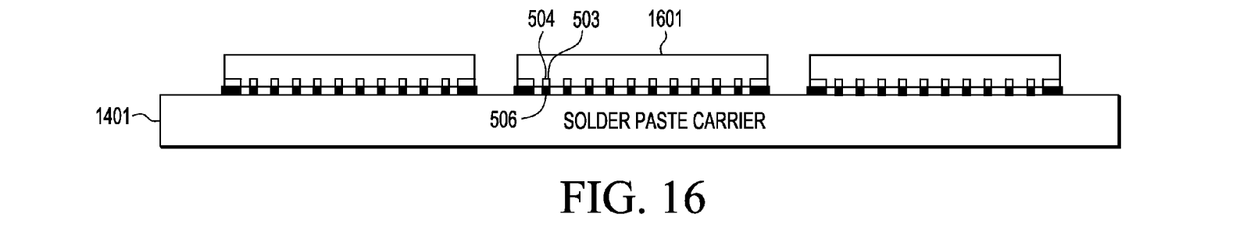
FIG. 16 is a cut view of the solder paste carrier of FIG. 15 showing solder paste on the solder paste carrier and showing three singulated packages in contact with the solder paste.
Figure 17:
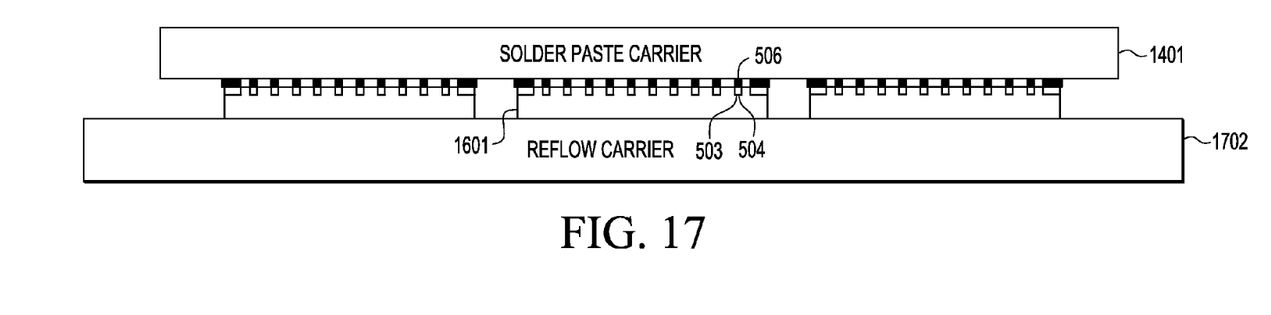
FIG. 17 is a cut view of the solder paste carrier, the solder paste on the solder paste carrier and the three singulated packages of FIG. 16, in an upside-down position relative to FIG. 16, on a reflow carrier prior to reflow.

In one embodiment, step 1303 is accomplished with a "pick and place" tool. FIG. 16 is a cut view of the solder paste carrier 1401 which shows paste 506 that has been stencil printed on the carrier, and showing the three packages 1601 in contact with the paste. Next, the packages, paste and carrier combination is flipped. The packages 1601 remain in contact with the solder paste carrier 1401 due to surface tension of the paste 506. At step 1304, the packages, paste and carrier combination is placed on the reflow carrier 1702. FIG. 17 is a cut view of the solder paste carrier 1401, the solder paste 506 on the solder paste carrier and the three packages 1601, in an upside-down position relative to FIG. 16, on a reflow carrier 1702 prior to reflow. The reflow carrier 1702 is typically a flat piece of graphite. The method includes placing the packages, paste, carrier and reflow carrier combination in an oven, and reflowing the solder when the packages 1601 are in an inverted (i.e., upside down or "dead bug") orientation. The oven may be a standard reflow oven such as an oven used for attaching a surface mount package to a PCB.

Figure 18:
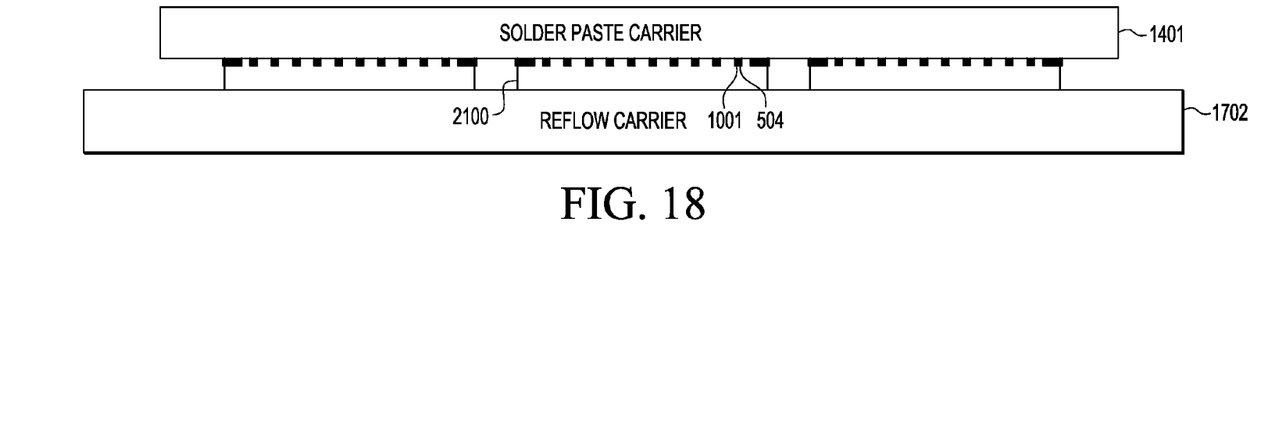
FIG. 18 is a cut view of the solder paste carrier and three singulated flat-pack no-lead packages in accordance with the invention, on the reflow carrier, subsequent to reflow.

At step 1305, the paste is reflowed. Reflow is performed in the inverted orientation to promote and maximize coverage of the lead ends with solder 1001, and so that gravity assists the solder to flow over the cut ends 504 of the lead frame. FIG. 18 is a cut view of the solder paste carrier 1401 and three packages 2100, on the reflow carrier 1702, after reflow. FIG. 18 shows that almost all of the paste 506 is gone from the solder paste carrier 1401 and that the solder paste carrier has collapsed upon the three packages 2100. FIG. 18 also shows that a coating of solder 1001 is on the cut ends 1002 of the packages 2100. In one embodiment of step 1305, the packages, paste, carrier and reflow carrier combination is in the reflow oven at a temperature above the melting point of solder for approximately 45-90 seconds, but a time and a peak temperature depends on the type of paste. In another embodiment, step 1304 is not performed, and the flow goes from step 1303 directly to step 1305.

Figure 19:
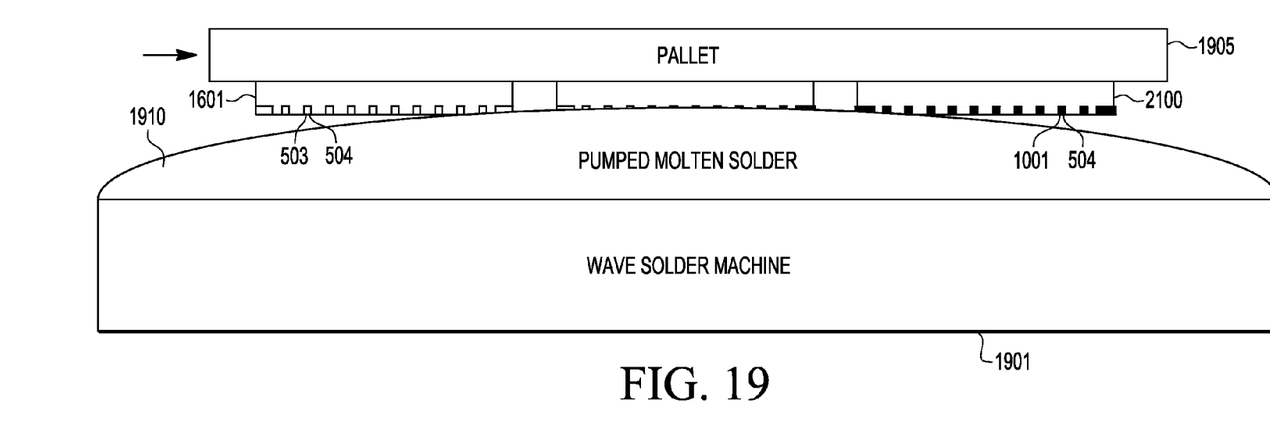
FIG. 19 is a cut view of three packages held by a pallet, wherein the bottom of the packages move into contact with molten solder as the pallet moves, thereby applying solder to cut ends of the lead frame of the package by solder wave.

FIG. 19 is a cut view of three packages held by a pallet 1905, wherein the bottom of the lead side of the packages come into contact with flowing molten solder 1910 of a wave solder machine 1901 as the pallet moves, thereby applying solder to cut ends of the lead frame of the package by a solder wave process. In FIG. 19, the arrow indicates that the direction of travel of the pallet 1905 is from left to right.

Figure 20:
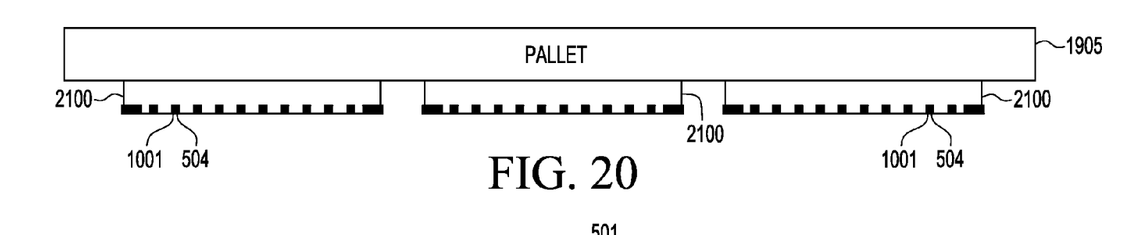
FIG. 20 is a cut view of the three packages held by the pallet after solder was applied to the cut ends of the lead frame of the packages by solder wave.

In a second alternate variation in the flow of the flow diagram 1300, a step 1306 comprises affixing packages 1601 to the pallet 1905, which may be attached to a belt (not shown) that moves the packages over the flowing molten solder 1910. The bottom of the package 1601 at the left side of FIG. 19 is not yet in contact with the flowing molten solder 1910. The bottom of the package at the center of FIG. 19 is in contact with the flowing molten solder 1910, and, as a result, solder is being applied to all portions of the leads including the cut ends 504 of the leads of the package at the center of FIG. 19. The bottom of the package at the right side of FIG. 19 has been in contact with the flowing molten solder 1910, resulting in manufacture of the package 2100. The entire bottom side and edges of the package 1601 go through a tin plating bath by the solder wave process of FIG. 19. In one embodiment, the solder is SAC305 or SAC405. FIG. 20 is a cut view of the three packages shown in FIG. 19 after applying solder 1001 to the cut ends 504 of the lead frame by the solder wave process, wherein, the three packages are now manufactured in accordance with the invention.

Step 1307 is the next step for both the first alternate variation and the second alternate variation of the flow diagram 1300. At step 1307, assembly is completed, and one or more packages 2100 have been produced which have cut ends 504 of lead frames that are wettable.

Figure 21:
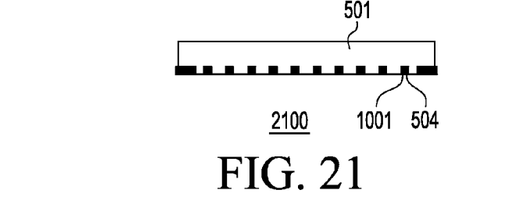
FIG. 21 is a side view of a flat-pack no-lead package manufactured in accordance with one of the methods of FIGS. 1 and 13, showing solder on the cut ends of the lead frame.

FIG. 21 is a side view of a package 2100 manufactured in accordance with one of the methods illustrated by the flow diagrams of FIGS. 1 and 13, showing solder 1001 on the cut ends 504 of the lead frame.

A lead frame of bare base metal, which has been neither plated nor tinned prior to singulation, also can be used with the methods in accordance with the invention. When such bare lead frame is used to manufacture the package 2100, solder is additionally applied to the bottom of lead frame to eliminate the wet chemistry required for tin plating.

Some embodiments do not require a recess at the end of a lead; the methods are also compatible with leads that do have a recess at the end of a lead. Some embodiments are compatible with standard industry assembly practices. The methods in accordance with some embodiments advantageously employ standard solder material (such as paste) and standard reflow methods to achieve a wettable lead end. Some embodiments do not require any particular angle of cutting the lead during the step of partial singulation. In one embodiment, the angle of cut is approximately perpendicular to the bottom of the package.

Instead of stencil printing paste, other methods of applying solder 1001 to a strip can be used, such as strip 200 or 300, include screen printing, solder performs, solder balls, using solder jetting, and using nanoparticle printing/spraying.

The methods in accordance with the invention are applicable to any microelectronic package that has at least one lead exposed both at the bottom and at a side of the package, i.e., the base lead frame metal of the at least one lead exists continuously at and around a corner of the package.

In one embodiment, the package 2100 is a quad, flat-pack no-lead (QFN) package (hereinafter "QFN-style package").

Examples of QFN-style packages are: a power quad flat-pack no-lead (PQFN) package, an extremely-thin quad flat-pack no-lead (XQFN) package, a depopulated very-thin quad flat-pack no-lead (DQFN) package, and a heatsink very-thin quad flat-pack no-lead (HVQFN) package. QFN-style packages may also include other types of flat-pack no-lead packages. In another embodiment, the package 2100 is a dual flat-pack no-lead (DFN) package.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

The Detailed Description section, and not the Abstract section, is intended to be used to interpret the claims. The Abstract section may set forth one or more but not all embodiments of the invention. The Abstract section is not intended to limit the invention or the claims in any way.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

Although the invention is described herein with reference to specific embodiments, various modifications and changes can be made without departing from the scope of the present invention as set forth in the claims below.

What is claimed is:

1. A method of manufacturing a microelectronic package, comprising:
   providing a lead frame strip that includes a plurality of lead frames, the lead frame strip having saw lanes between the lead frames;
   encapsulating the lead frame strip;
   after encapsulating, removing metal of the lead frame strip along the saw lanes;
   after removing metal, applying solder to the lead frame strip;
   reflowing the solder; and
   singulating the lead frame strip into individual microelectronic packages after the reflowing.

2. The method of manufacturing a microelectronic package of claim 1, wherein the step of removing includes removing by one of sawing and etching.

3. The method of manufacturing a microelectronic package of claim 1, wherein the step of removing the metal from the lead frame strip along the saw lanes removes all metal from the lead frame strip along the saw lanes and maintains at least some mold compound along the saw lanes.

4. The method of manufacturing a microelectronic package of claim 1, wherein the step of applying solder to the lead frame strip includes applying one of solder cream and solder paste (hereinafter "paste") using a stencil having a pattern of openings whose locations correspond to location of leads of the lead frame strip.

5. The method of manufacturing a microelectronic package of claim 4, wherein the step of applying solder to the lead frame strip includes applying paste to all portions of the lead frame that is not covered by mold compound.

6. The method of manufacturing a microelectronic package of claim 4, wherein the step of applying solder to the lead frame strip includes applying paste to only along the saw lanes.

7. The method of manufacturing a microelectronic package of claim 1, wherein base metal of the lead frame strip is not plated, and wherein the step of applying solder includes applying solder to a bottom of the lead frame.

8. The method of manufacturing a microelectronic package of claim 1, wherein the step of reflowing the solder includes reflowing the solder until surfaces of bare base metal are covered with a coating of solder.

9. The method of manufacturing a microelectronic package of claim 1, wherein the package is one of a quad flat-pack no-lead (QFN) package and a dual flat-pack no-lead (DFN) package.

10. A method of manufacturing a microelectronic package, comprising:
    providing a lead frame strip that includes a plurality of lead frames, the lead frame strip having saw lanes between the lead frames;
    encapsulating the lead frame strip;
    after encapsulating the lead frame strip, applying solder to the lead frame strip;
    reflowing the solder;
    removing metal of the lead frame strip and the solder along the saw lanes, thereby creating a surface of bare base metal;
    reflowing the solder; and
    singulating the lead frame strip into individual microelectronic packages.

11. The method of manufacturing a microelectronic package of claim 10, wherein step of applying solder to the lead frame strip includes applying one of solder cream and solder paste to only along the saw lanes.

12. The method of manufacturing a microelectronic package of claim 10, including, subsequent to the step of removing metal and prior to the second step of reflowing, a step of adding flux to the bare base metal.

13. The method of manufacturing a microelectronic package of claim 12, wherein the second step of reflowing the solder includes reflowing the solder until surfaces of bare base metal are covered with a coating of solder.

14. The method of manufacturing a microelectronic package of claim 10, wherein the step of applying solder includes one of: screen printing, solder performs, solder balls, using solder jetting, and using nanoparticle printing/spraying.

15. The method of manufacturing a microelectronic package of claim 10, wherein base metal of the lead frame strip is not plated, and wherein the step of applying solder includes applying one of solder cream and solder paste to an entire bottom of the lead frame.

16. The method of manufacturing a microelectronic package of claim 10, wherein the package is one of a quad flat-pack no-lead (QFN) package and a dual flat-pack no-lead (DFN) package.

17. A method of manufacturing a microelectronic package, comprising:
   a) providing a package that has at least one lead having a portion at a bottom of the package and a portion at a side of the package, wherein the at least one lead has a surface located in a plane approximately orthogonal to a plane of the bottom of the package;
   b) applying solder to a solder carrier;
   c) placing the package on the solder that is on the solder carrier, wherein cut lead ends of the package are aligned with the solder;
   d) placing a combination of the package, the solder and the solder carrier on a reflow carrier; and
   e) reflowing the solder until the surface of the at least one lead located in the plane approximately orthogonal to the plane of the bottom of the package becomes solder wettable.

18. The method of manufacturing a microelectronic package of claim 17, including subsequent to step c) and prior to step d), a step of inverting the combination of the package, the solder and the solder carrier.

19. The method of manufacturing a microelectronic package of claim 17, wherein the package is one of a quad flat-pack no-lead (QFN) package and a dual flat-pack no-lead (DFN) package.

20. The method of manufacturing a microelectronic package of claim 17 wherein the step of applying solder to the solder carrier includes applying solder to only certain portions of the solder carrier wherein the certain portions correspond to an area of the at least one lead and to an area adjacent to the at least one lead and slightly beyond a perimeter of the package.

* * * * *